US007954079B2

(12) United States Patent  
Kim et al.

(10) Patent No.: US 7,954,079 B2
(45) Date of Patent: May 31, 2011

(54) METHOD FOR COMPENSATING PERFORMANCE DEGRADATION OF RFIC USING EM SIMULATION

(75) Inventors: Yu Sin Kim, Daejeon (KR); Chang Seok Lee, Daejeon (KR); Chang Soo Yang, Seongnam (KR); Kwang Du Lee, Damyang (KR); Hak Sun Kim, Daejeon (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 543 days.

(21) Appl. No.: 11/943,211

(22) Filed: Nov. 20, 2007

(65) Prior Publication Data
US 2008/0134112 A1    Jun. 5, 2008

(30) Foreign Application Priority Data

Nov. 21, 2006  (KR) .......................... 10-2006-0114964

(51) Int. Cl.
    *G06F 17/50*    (2006.01)
(52) U.S. Cl. ...................................... 716/132
(58) Field of Classification Search .................. 716/104, 716/132, 139
    See application file for complete search history.

(56) References Cited

U.S. PATENT DOCUMENTS

| 6,557,145 B2 * | 4/2003 | Boyle et al. ..................... 716/2 |
| 7,152,215 B2 * | 12/2006 | Smith et al. ..................... 716/4 |

FOREIGN PATENT DOCUMENTS

| JP | 2000-035982 A | 2/2000 |
| JP | 2001-117960 A | 4/2001 |
| JP | 2002-197133 A | 7/2002 |
| JP | 2003-124321 A | 4/2003 |
| JP | 2004-318316 A | 11/2004 |
| JP | 2005-267019 A | 9/2005 |
| KR | 10-2000-0029237 A | 5/2000 |

OTHER PUBLICATIONS

Korean Intellectual Property Office, Notice of Allowance issued Jun. 25, 2008, (not translate yet).

* cited by examiner

*Primary Examiner* — Thuan Do
(74) *Attorney, Agent, or Firm* — Lowe, Hauptman, Ham & Berner, LLP

(57) ABSTRACT

Provided is a method for compensating performance degradation of a radio frequency integrated circuit (RFIC) using an EM simulation. The method includes the steps of: (a) extracting the design specifications of the RFIC so as design and simulate a circuit; (b) designing the layout of the designed and simulated circuit, and extracting layout parameters by using the designed layout; (c) simplifying the layout and carrying out the EM simulation to extract performance parameters; (d) carrying out a circuit simulation by using the extracted layout parameters and performance parameters, and judging whether the results of the circuit simulation satisfy the design specifications of the RFIC or not; (e) when it is judged that the results of the circuit simulation satisfy the design specifications of the RFIC, performing a circuit manufacturing process; and (f) when it is not judged that the results of the circuit simulation satisfy the design specifications of the RFIC, partially removing the layout, and carrying out the EM simulation, thereby analyzing and compensating a performance degradation region.

3 Claims, 15 Drawing Sheets

[FIG. 1]
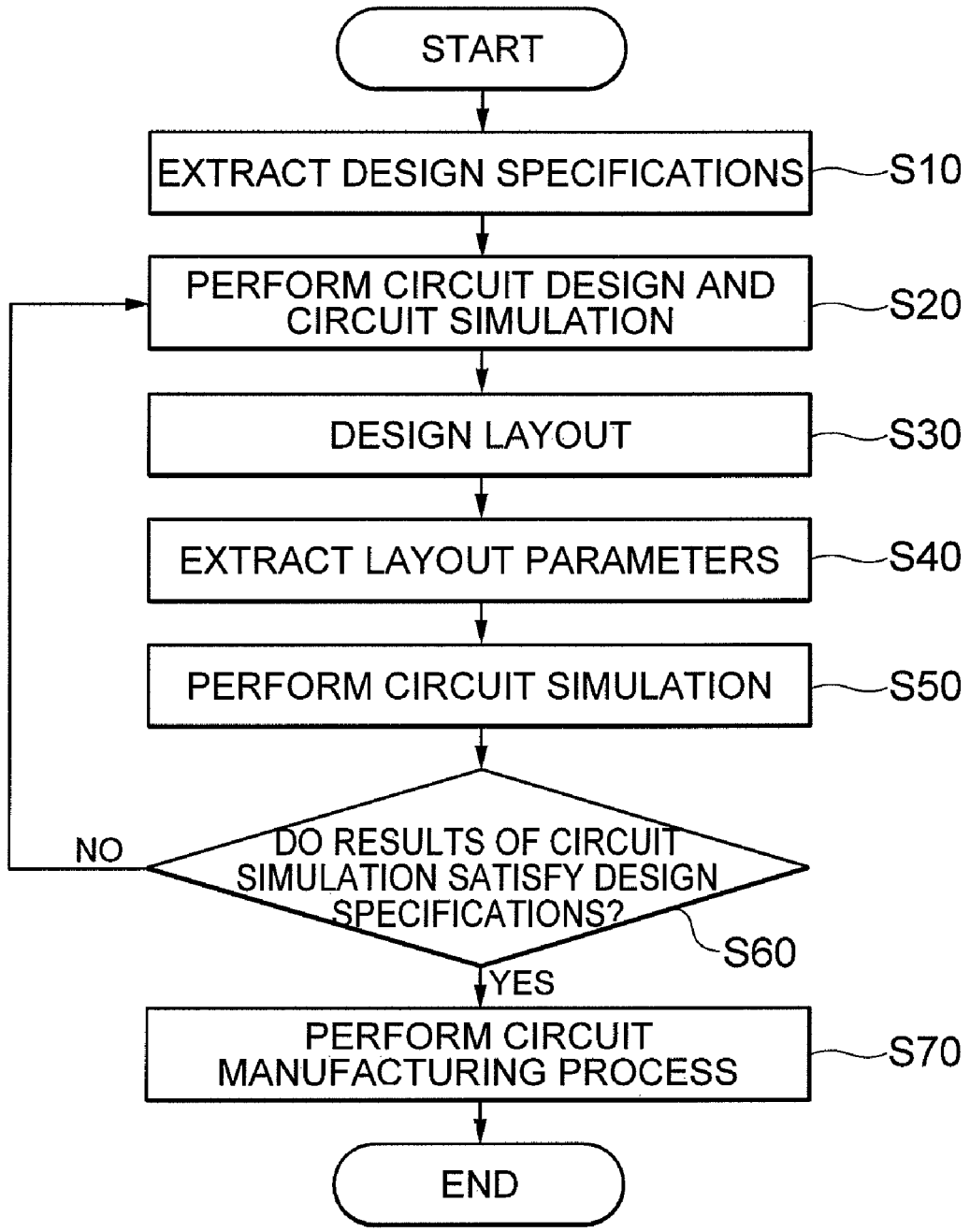

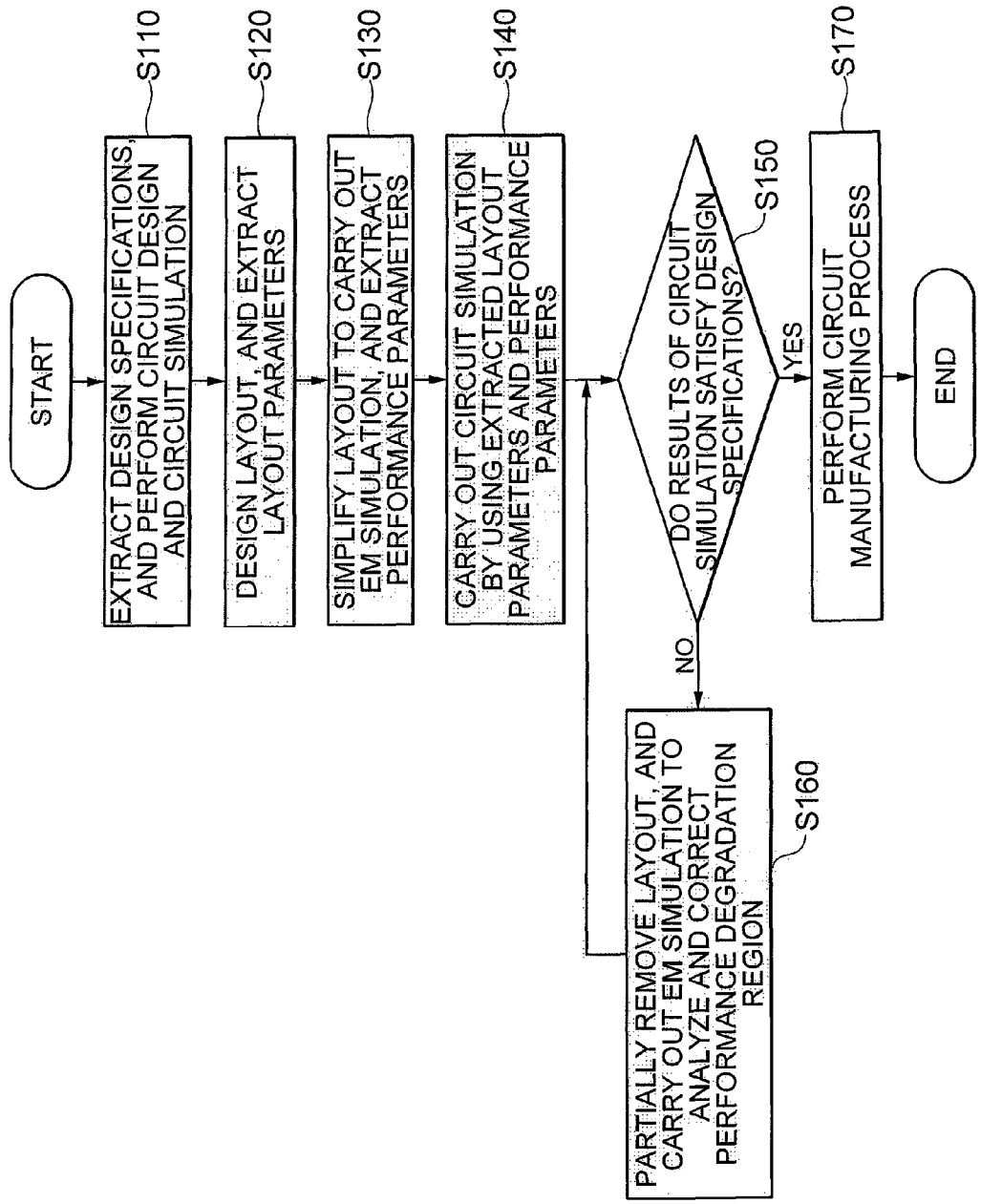

[FIG. 3]
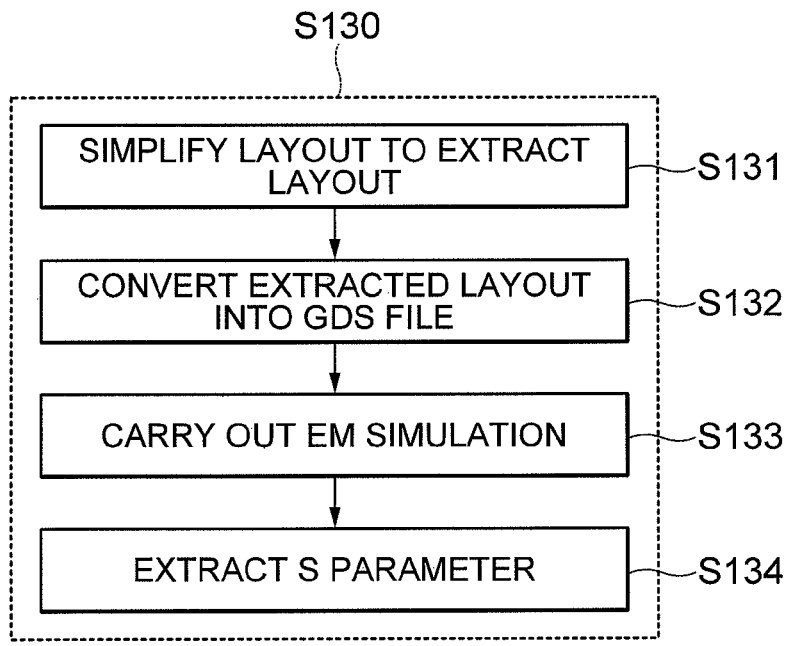
[FIG. 4A]
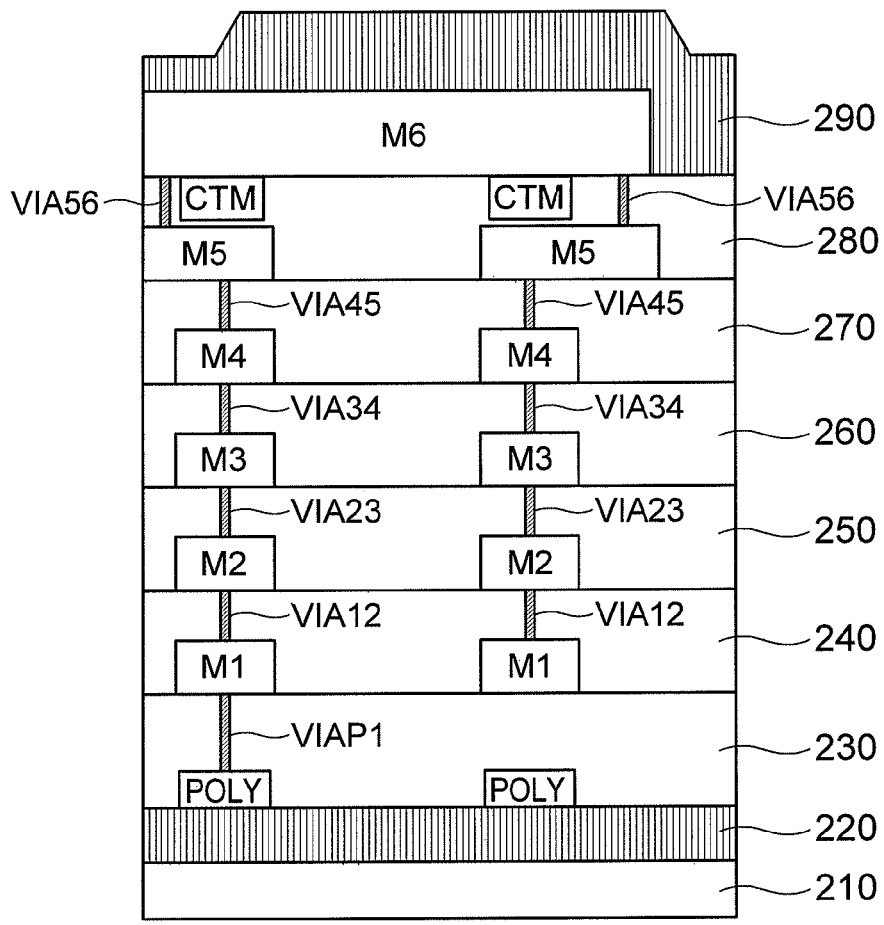

[FIG. 4B]
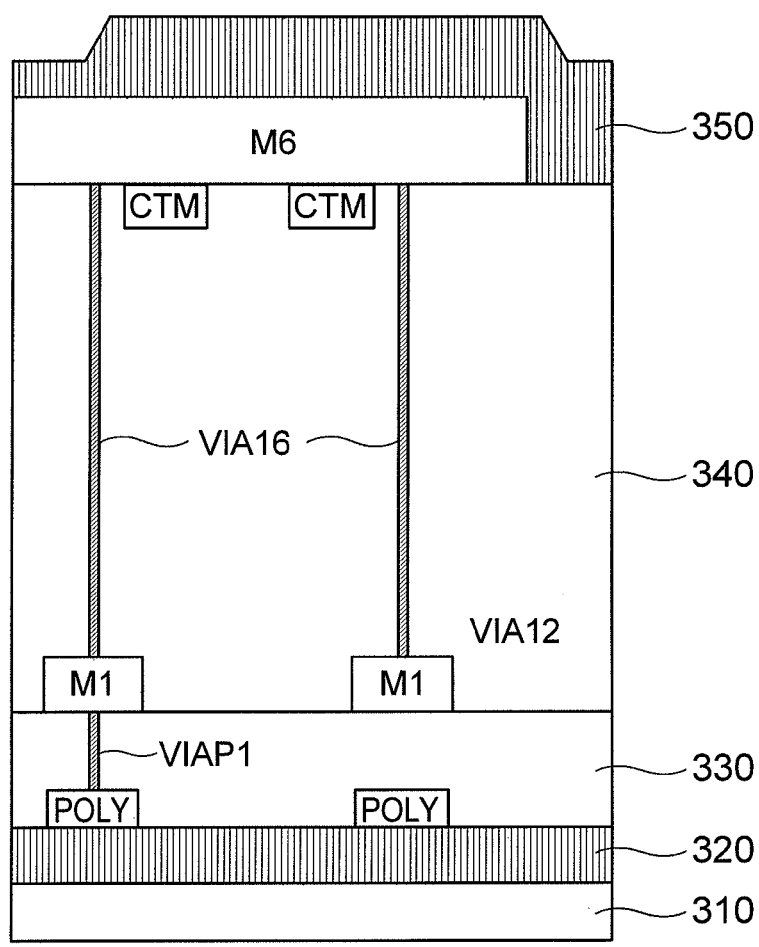
[FIG. 5]
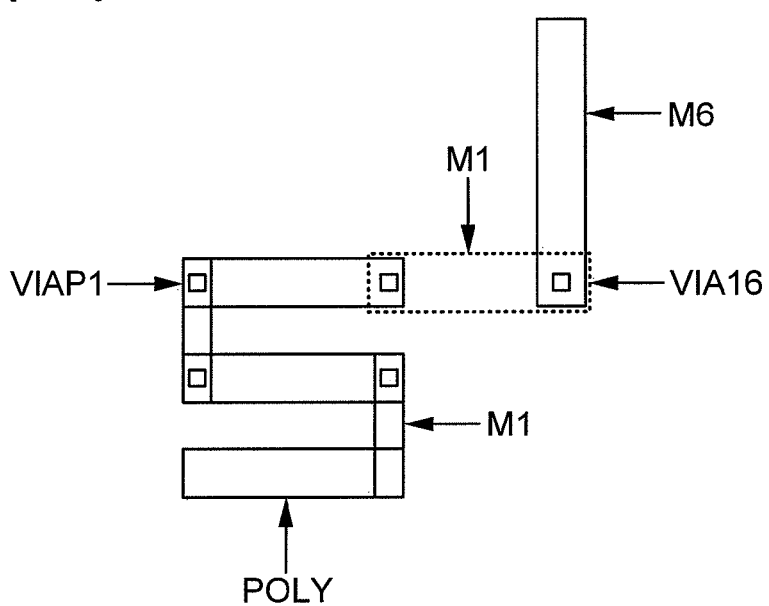

[FIG. 6]
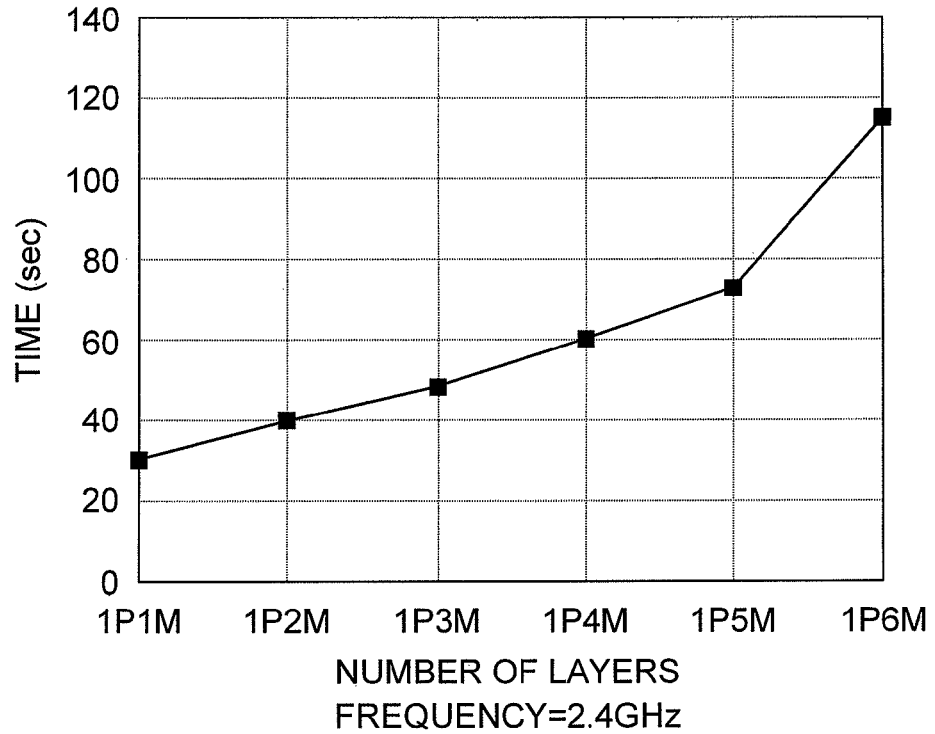
[FIG. 7]
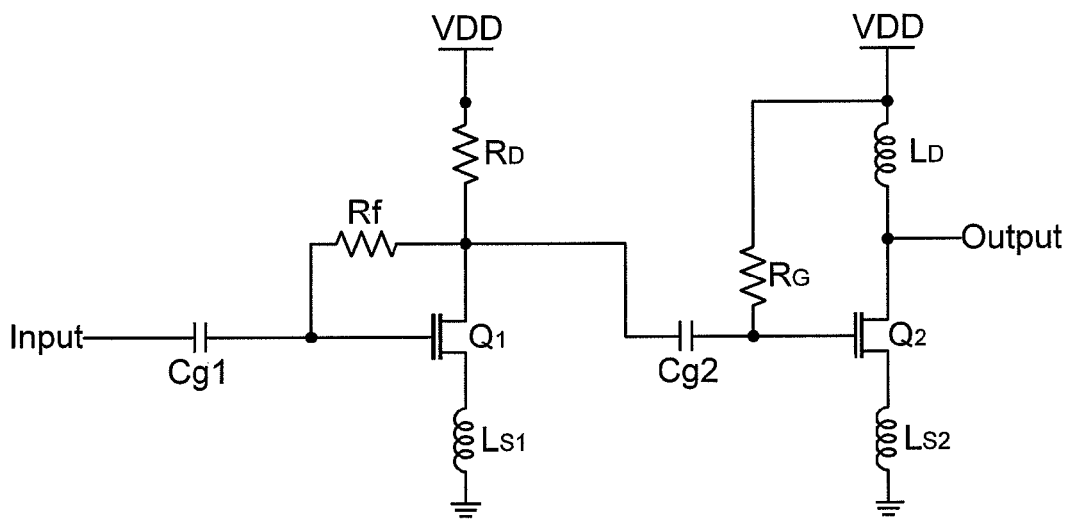

[FIG. 8]
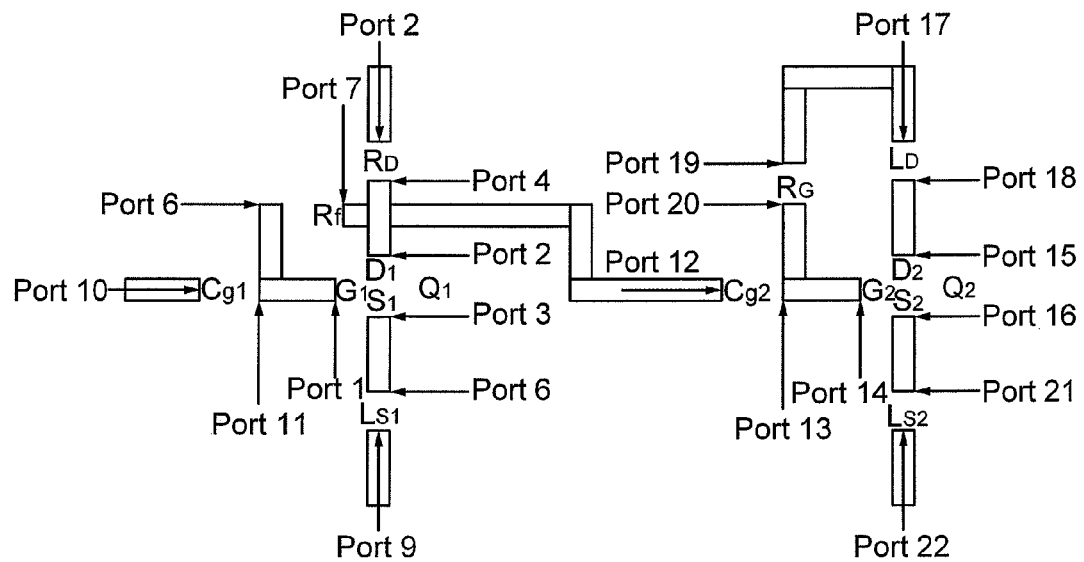
[FIG. 9]
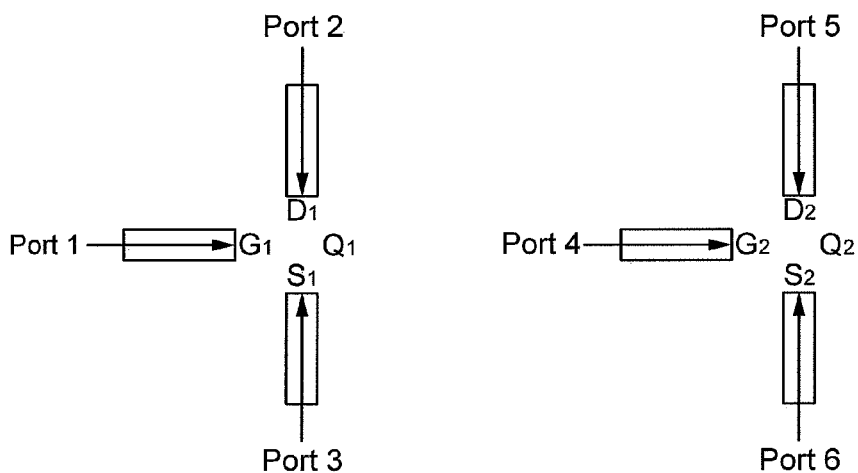

[FIG. 10]
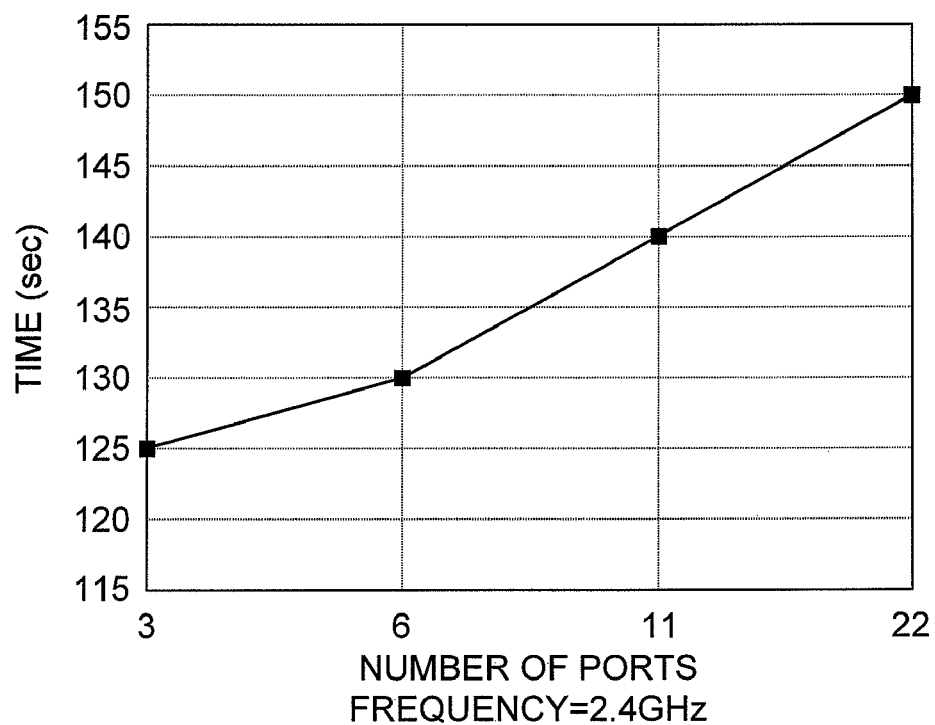
[FIG. 11A]
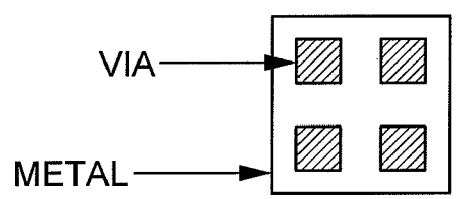
[FIG. 11B]
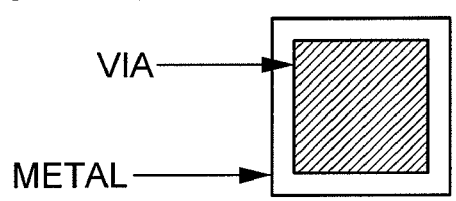

[FIG. 12]
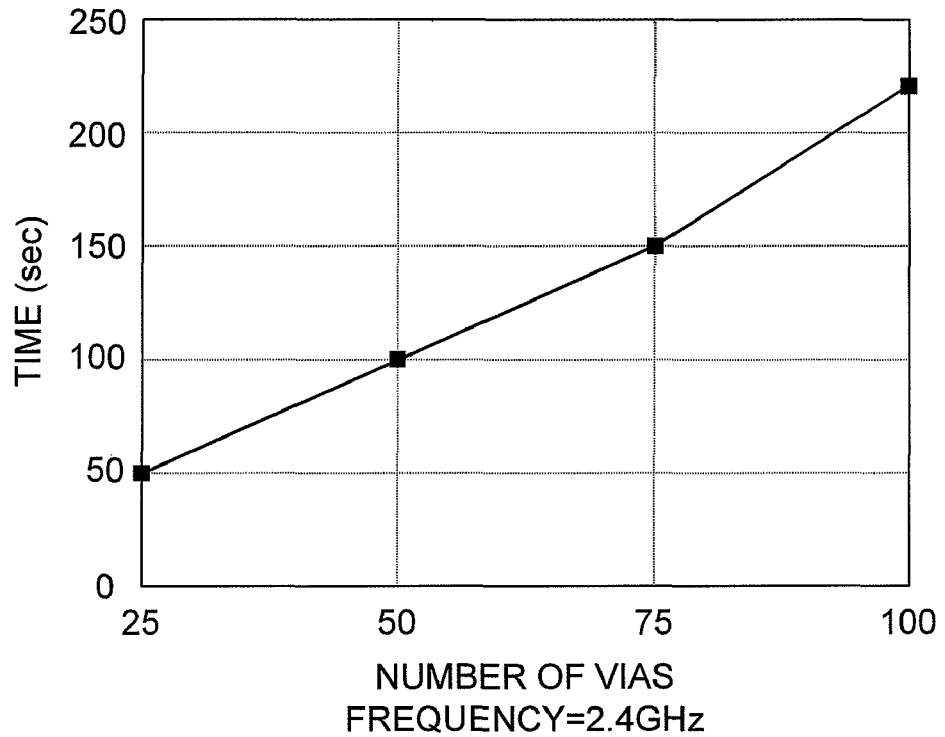
NUMBER OF VIAS
FREQUENCY=2.4GHz
[FIG. 13]
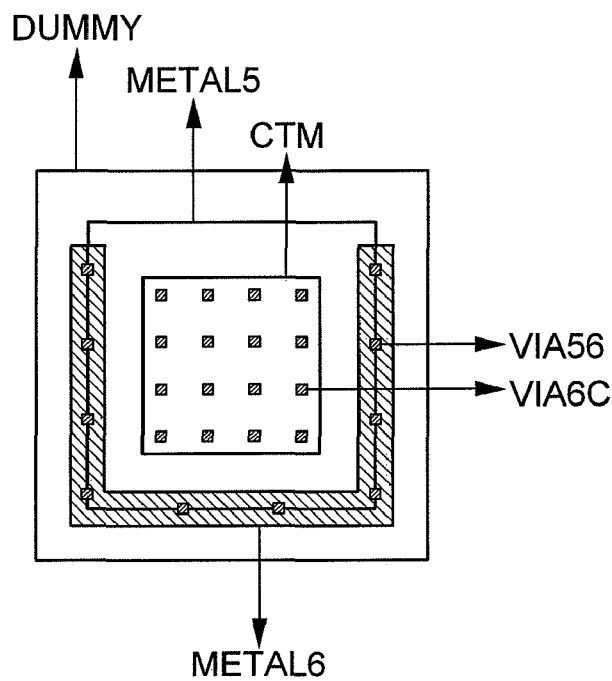

[FIG. 14A]
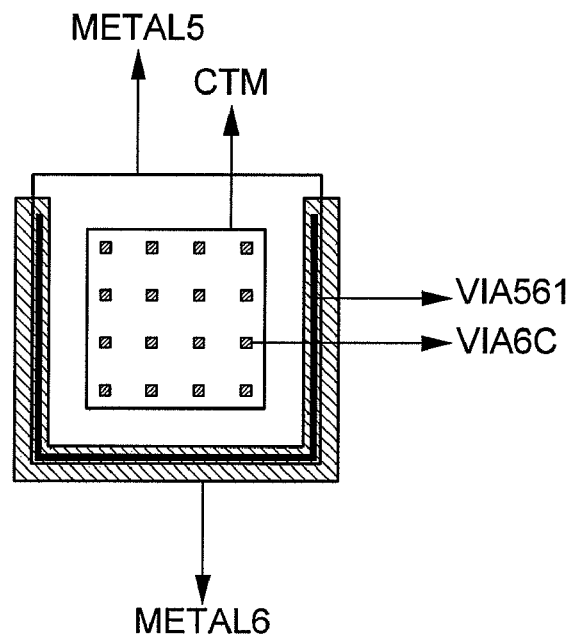
[FIG. 14B]
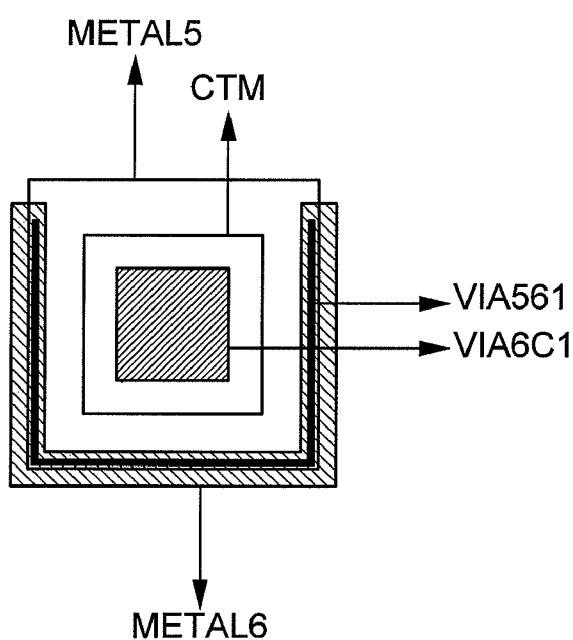

[FIG. 15]
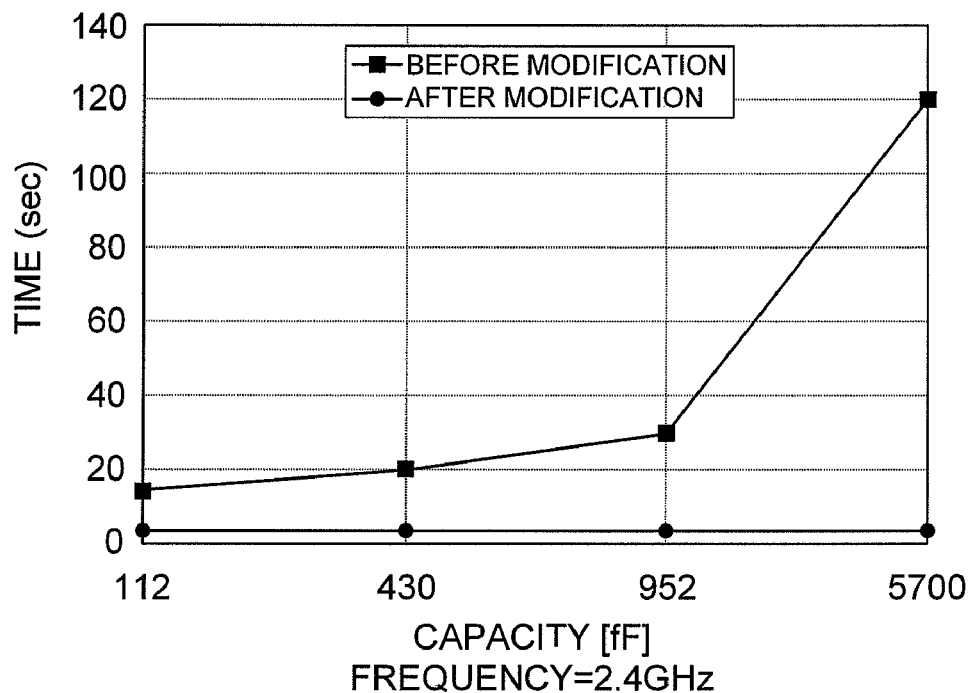
[FIG. 16]
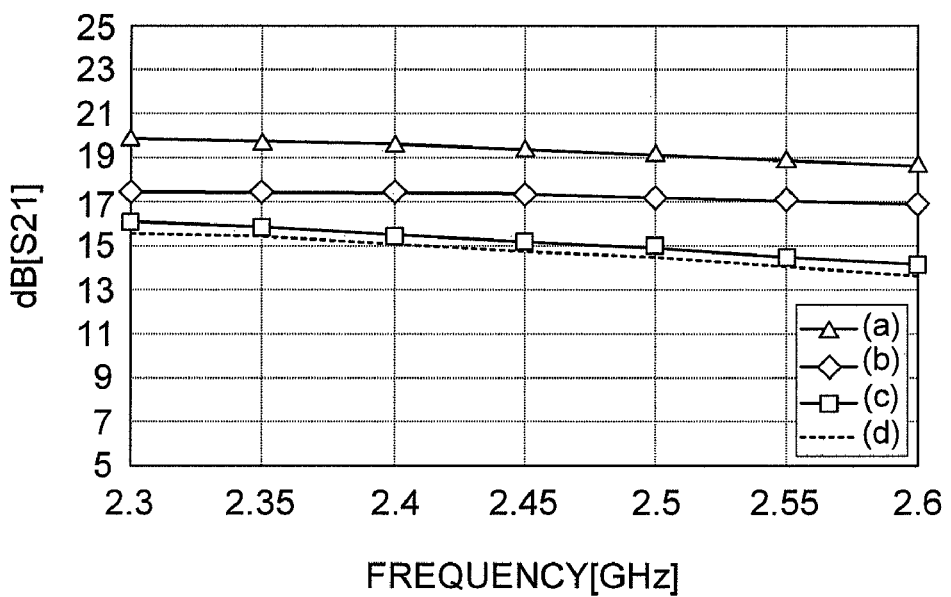

[FIG. 17]
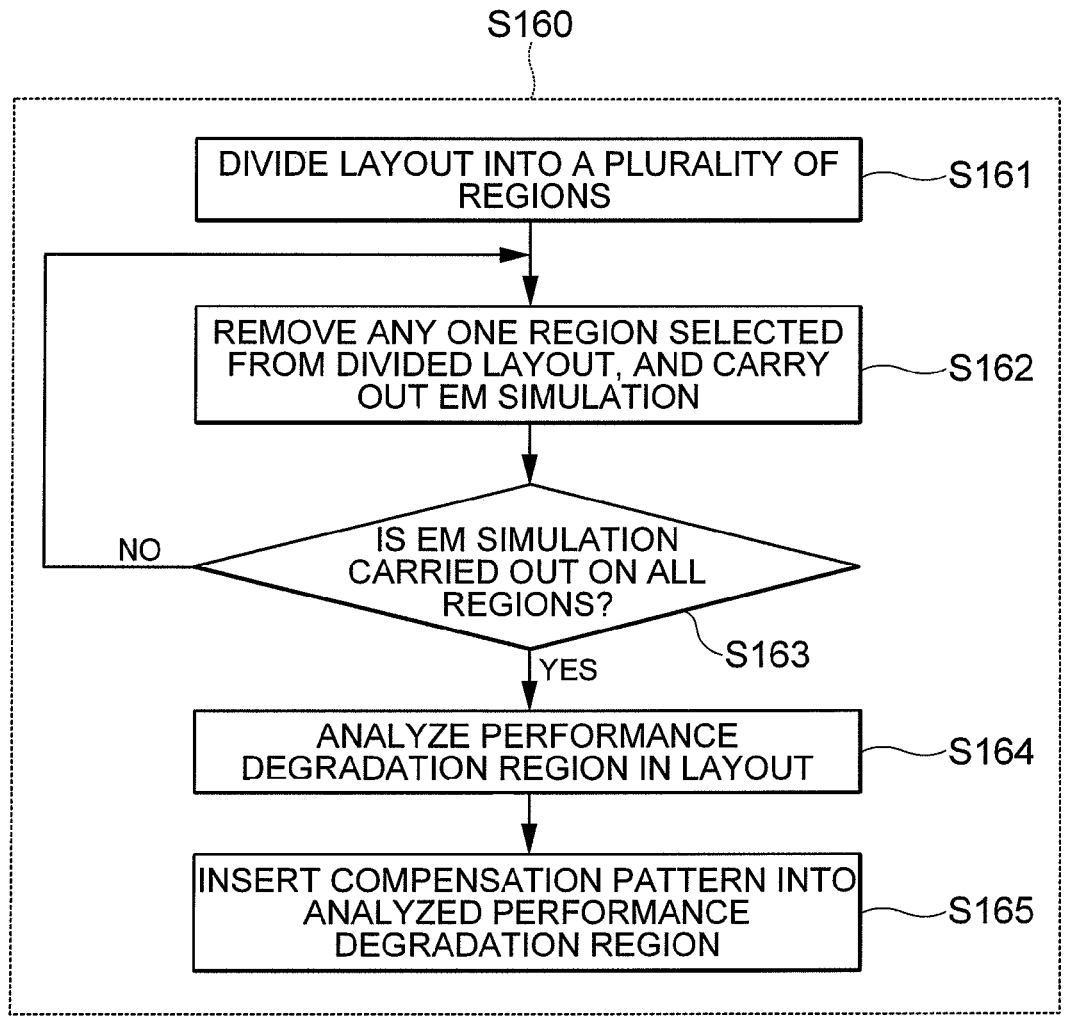

[FIG. 18]
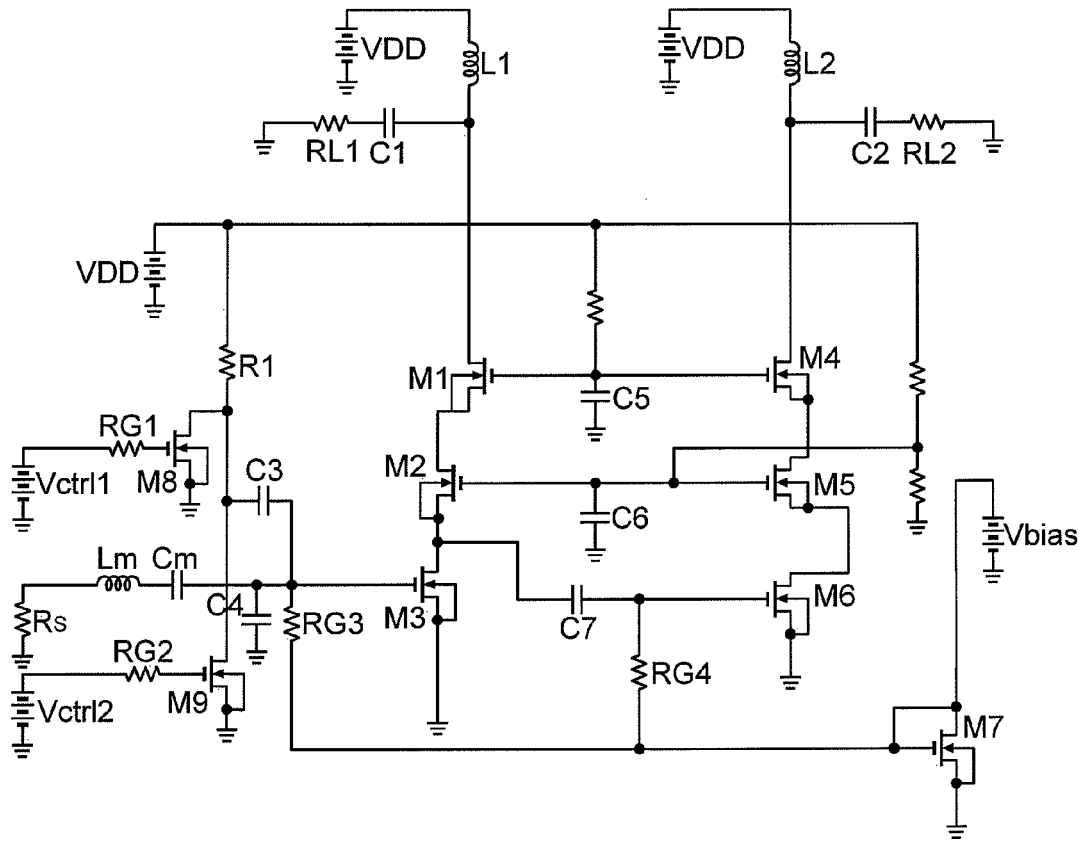
[FIG. 19]
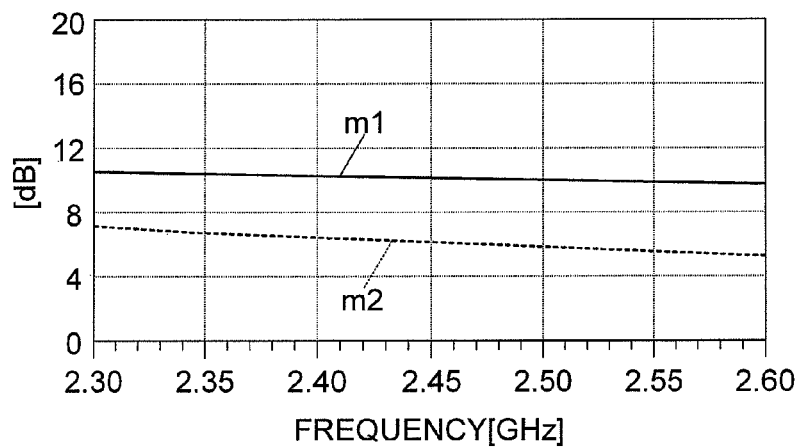

[FIG. 20]
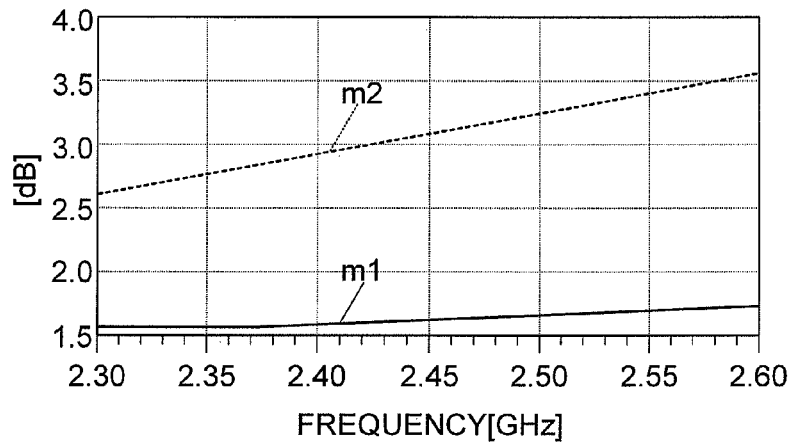
[FIG. 21]
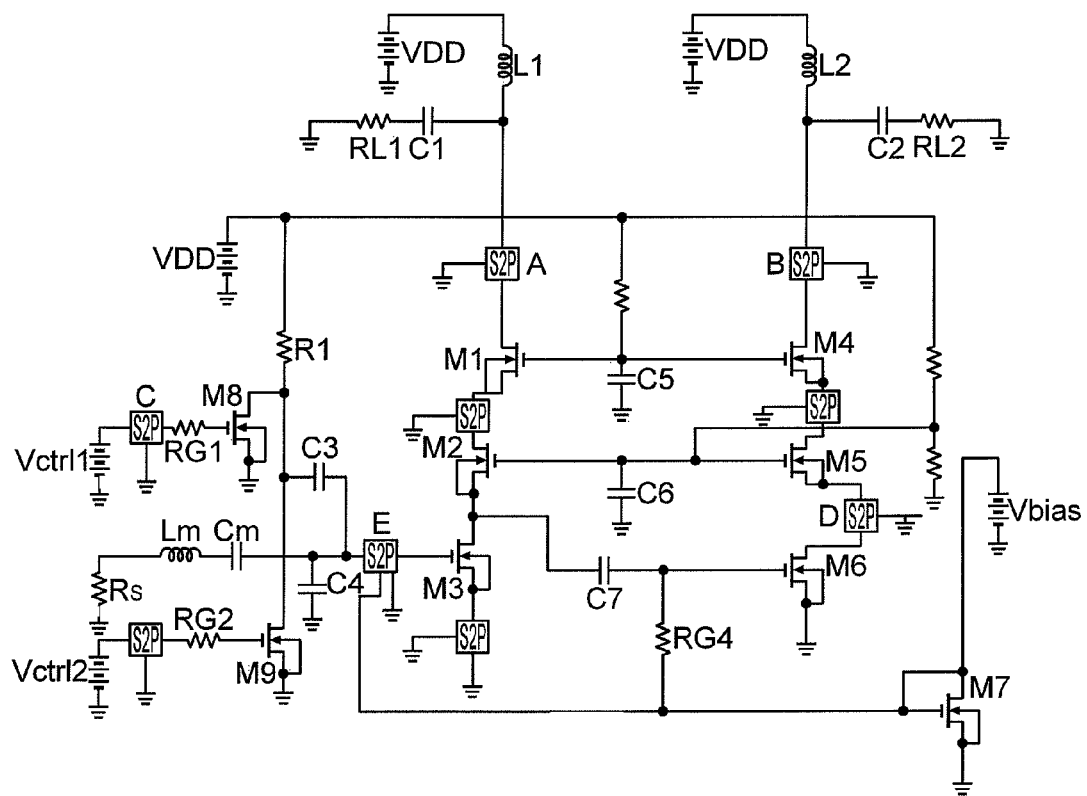

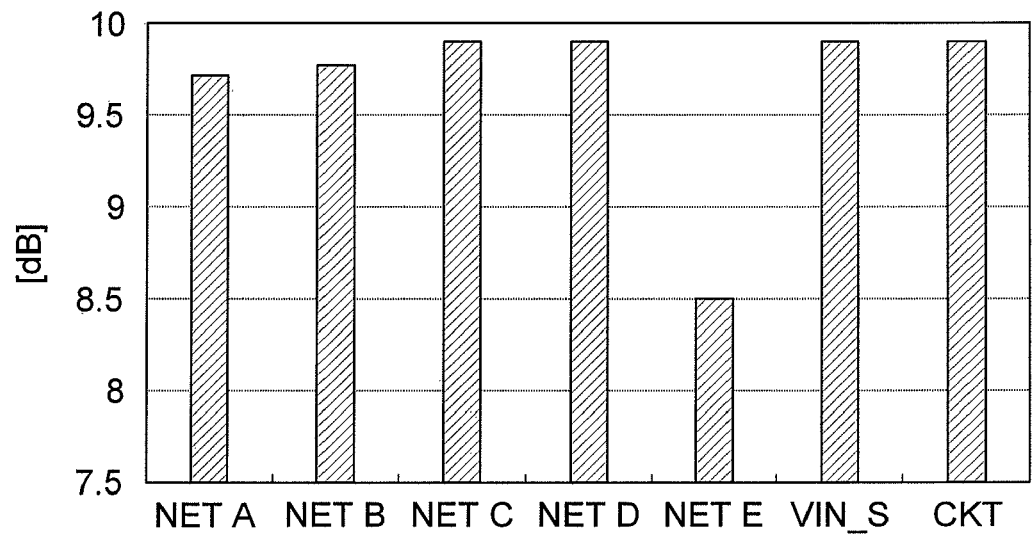
[FIG. 22]
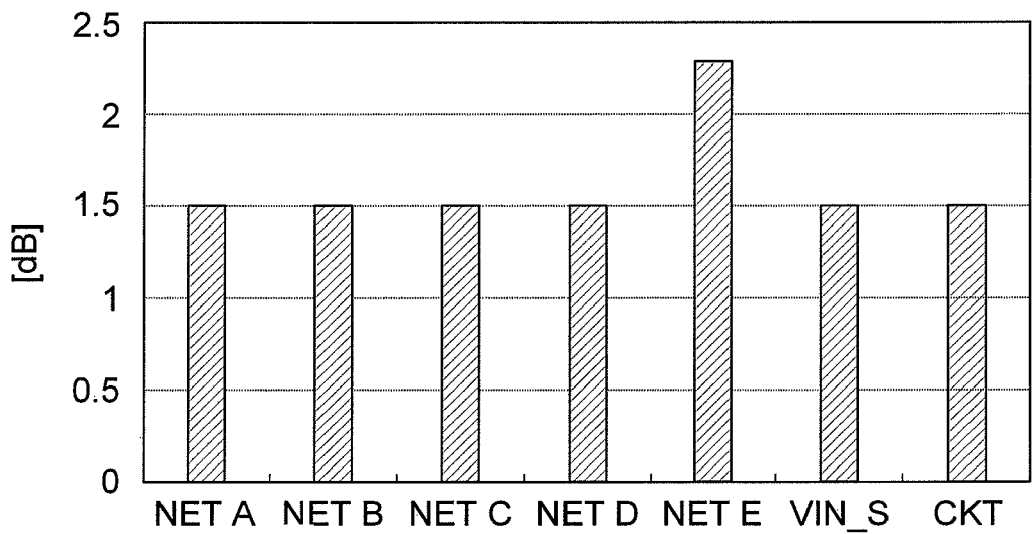
[FIG. 23]

[FIG. 24]
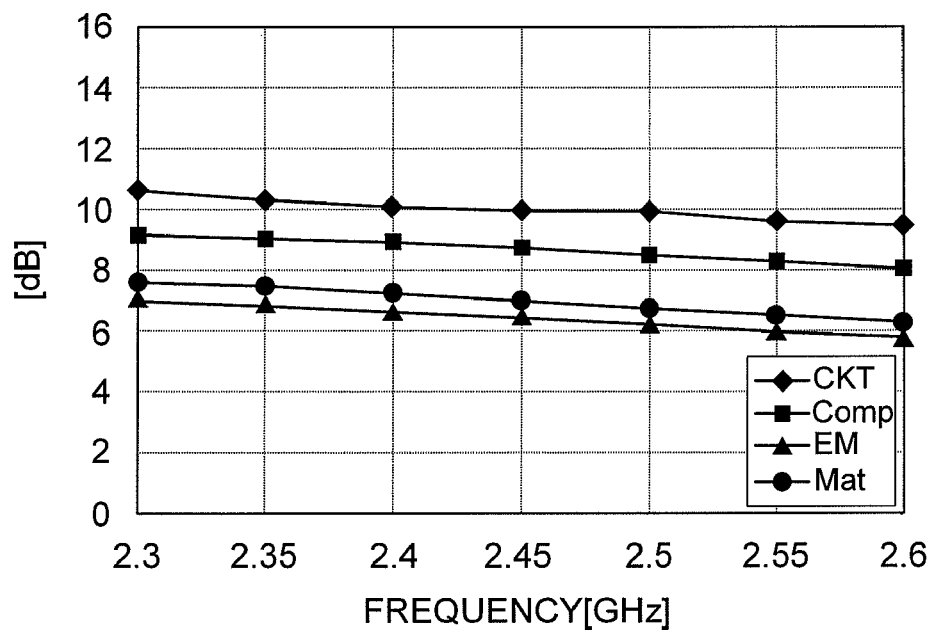
[FIG. 25]
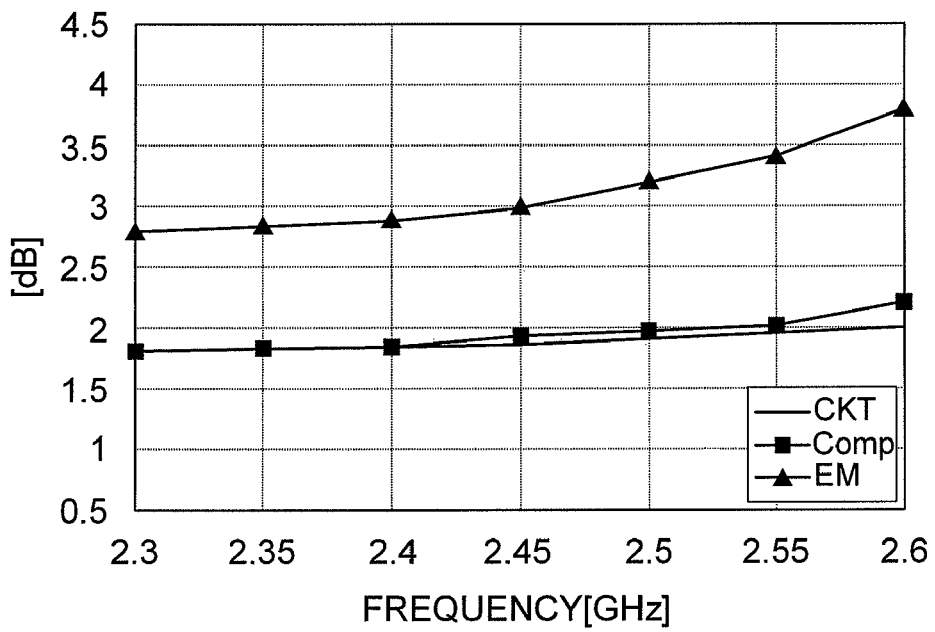

METHOD FOR COMPENSATING PERFORMANCE DEGRADATION OF RFIC USING EM SIMULATION

CROSS-REFERENCE TO RELATED APPLICATIONS

This application claims the benefit of Korean Patent Application No. 10-2006-0114964 filed with the Korea Intellectual Property Office on Nov. 21, 2006, the disclosure of which is incorporated herein by reference.

BACKGROUND OF THE INVENTION

1. Field of the Invention

The present invention relates to a method for compensating performance degradation of a radio frequency integrated circuit (RFIC) using an electromagnetic (EM) simulation, which analyzes and compensates a performance degradation region of the RFIC by using the EM simulation.

2. Description of the Related Art

In general, an RFIC is referred to as a circuit in which an RF circuit is implemented on one semiconductor chip using active and passive elements. The RFIC mainly includes an amplifier, a transmitter/receiver, a synthesizer and so on.

Such an RFIC operates in a several GHz band. Therefore, to predict the characteristic of the RFIC, an analysis on interference depending on the layout of the respective elements is essential. To perform fast analysis, a layout simulator is used.

Recently, the development speed of wireless communication systems gradually increases, and the high integration of wireless communication parts is realized. Therefore, there is a demand for a method for carrying out a fast and accurate layout simulation on more complex circuits and a method for compensating performance degradation.

Hereinafter, a conventional method for designing an RFIC will be described with accompanying drawings.

FIG. 1 is a flow chart sequentially showing a conventional method for designing an RFIC.

First, as shown in FIG. 1, the design specifications of an RFIC are extracted in accordance with characteristics of the RFIC (step S10).

After the design specifications are extracted in step S10, a semiconductor process is set in consideration of the performance and manufacturing cost of the RFIC, a circuit is designed using characteristics of active and passive elements required when the RFIC is designed, and a circuit simulation of the designed circuit is carried out using a circuit simulation tool (step S20).

When the circuit design is completed, a layout is carried out on the basis of the designed circuit. In the layout process, the size of the RFIC and the distance and disposition of pads required for measurement are determined. Further, the active and passive elements are respectively disposed and connected to each other through a transmission line (step S30).

When the layout process is completed, a layout parameter extraction process is performed. In the layout parameter extraction process, a DRC (Design Rule Checker) for checking whether the layout satisfies a process condition of the RFIC or not, a LVS (Layout Versus Schematic) for checking whether the wiring connection of the layout coincides with a circuit diagram or not, and a parasitic parameter are extracted to carry out RCX, in which a circuit simulation is carried out, thereby analyzing a layout characteristic (step S40).

The layout parameters extracted through step S40 are applied to the circuit simulation tool so as to carry out a circuit simulation (step S50).

Then, it is judged whether or not the results of the circuit simulation carried out in step S50 satisfy the design specifications of the RFIC (step S60).

When it is not judged at step S60 that the results of the circuit simulation satisfy the design specifications of the RFIC, the process is fed back to step S20. Then, the process is repeated from the step for performing the circuit design.

Otherwise, when it is judged at step S60 that the results of the circuit simulation satisfy the design specifications of the RFIC, a process of manufacturing the RFIC is performed (step S70).

In the conventional method, however, the results of the circuit simulation may differ from the measured results, because of an effect of interference depending on the layout of elements. In this case, the circuit should be re-designed, so that the circuit design time increases.

Further, when the simulation using the simulation tool is carried out on the RFIC which gradually becomes complex, a long time is required. Therefore, the circuit analysis process takes a long time.

SUMMARY OF THE INVENTION

An advantage of the present invention is that it provides a method for compensating performance degradation of an RFIC using an EM simulation, which analyzes and compensates a performance degradation region of the RFIC by using the EM simulation.

Additional aspects and advantages of the present general inventive concept will be set forth in part in the description which follows and, in part, will be obvious from the description, or may be learned by practice of the general inventive concept.

According to an aspect of the invention, a method for compensating performance degradation of a radio frequency integrated circuit (RFIC) using an EM simulation comprises the steps of: (a) extracting the design specifications of the RFIC so as design and simulate a circuit; (b) designing the layout of the designed and simulated circuit, and extracting layout parameters by using the designed layout; (c) simplifying the layout and carrying out the EM simulation to extract performance parameters; (d) carrying out a circuit simulation by using the extracted layout parameters and performance parameters, and judging whether the results of the circuit simulation satisfy the design specifications of the RFIC or not; (e) when it is judged that the results of the circuit simulation satisfy the design specifications of the RFIC, performing a circuit manufacturing process; and (f) when it is not judged that the results of the circuit simulation satisfy the design specifications of the RFIC, partially removing the layout, and carrying out the EM simulation, thereby analyzing and compensating a performance degradation region.

Preferably, step (f) includes the steps of: (f-1) dividing the layout into a plurality of regions; (f-2) removing any one region selected from the divided layout, and carrying out the EM simulation; (f-3) judging whether the EM simulation is carried out on all the regions or not; (f-4) when it is judged that the EM simulation is carried out on all the regions, analyzing a performance degradation region of the layout; and (f-5) inserting a compensation pattern into the analyzed performance degradation region.

Preferably, when it is not judged at step (f-3) that the EM simulation is carried out on all the regions, the process is fed back to step (f-2).

The analyzing of the performance degradation region at step (f-4) may be performed by measuring gains of the circuit and then comparing the gains.

The analyzing of the performance degradation region at step (f-4) may performed by measuring noise figures of the circuit and then comparing the noise figures.

The analyzing of the performance degradation region at step (f-4) may performed by measuring gains and noise figures of the circuit and then comparing the gains and the noise figures, respectively.

Preferably, in step (f-5), the performance degradation region of the layout is grounded so as to be compensated.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a flow chart sequentially showing a conventional method for designing an RFIC;

FIG. 2 is a flow chart sequentially showing a method for compensating performance degradation of an RFIC using an EM simulation according to the present invention;

FIG. 3 is a flow chart sequentially showing the EM simulation process according to the invention;

FIGS. 4A and 4B are cross-sectional views of complementary metal oxide semiconductors (CMOS) for explaining a layout simplification method according to a first embodiment of the invention;

FIG. 5 is a diagram showing a layout pattern in which the number of metals is reduced;

FIG. 6 is a graph showing simulation times in accordance with the number of metals;

FIG. 7 is a circuit diagram of a 2-stage amplifier for explaining a layout simplification method according to a second embodiment of the invention;

FIG. 8 is a layout for comparing the numbers of ports in the layout simplification method according to the second embodiment of the invention;

FIG. 9 is a layout showing the number of ports of a transistor according to the second embodiment of the invention;

FIG. 10 is a graph showing a simulation time in accordance with the number of ports;

FIGS. 11A and 11B are cross-sectional views of layout patterns for explaining a layout simplification method according to a third embodiment of the invention;

FIG. 12 is a graph showing an EM simulation time in accordance with the number of vias;

FIG. 13 is a diagram showing the layout of a capacitor before the capacitor is modified;

FIGS. 14A and 14B are diagrams showing the layout of the capacitor simplified by a layout simplification method according to a fourth embodiment of the invention;

FIG. 15 is a graph comparatively showing the EM simulation times before and after the capacitor is modified;

FIG. 16 a graph comparatively showing the EM simulation and the conventional simulations.

FIG. 17 is a flow chart sequentially showing the method for compensating performance degradation of an RFIC according to the invention;

FIG. 18 is a circuit diagram of a low-noise amplifier for explaining the method for compensating performance degradation;

FIG. 19 is a graph showing gains of the low-noise amplifier in a high-gain mode;

FIG. 20 is a graph showing noise figures of the low-noise amplifier in the high-gain mode;

FIG. 21 is a circuit diagram of the low-noise amplifier which is divided into a plurality of regions;

FIGS. 22 and 23 are graphs showing gains and noise figures of the respective regions, respectively; and FIGS. 24 and 25 are graphs showing gains and noise figures before and after a performance degradation is compensated.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a method for compensating performance degradation of an RFIC using an EM simulation according to the present invention will be described in detail with reference to the accompanying drawings.

FIG. 2 is a flow chart sequentially showing a method for compensating performance degradation of an RFIC using an EM simulation according to the present invention. FIG. 3 is a flow chart sequentially showing the EM simulation process according to the invention.

In the method for compensating performance degradation of an RFIC using an EM simulation, first, the design specifications of an RFIC are extracted depending on characteristics of the RFIC, as shown in FIG. 2.

After the design specifications are extracted, a semiconductor process of the RFIC is set in consideration of the performance and manufacturing cost of the RFIC, a circuit is designed using characteristics of active and passive elements required when the RFIC is designed, and a circuit simulation of the designed circuit is carried out by a circuit simulation tool (step S110).

When the circuit design is completed, a layout is carried out on the basis of the designed circuit. In the layout process, the size of a chip and the distance and disposition of pads required for measurement are determined. Further, the active and passive elements are respectively disposed and connected to each other through a transmission line.

When the layout process is completed, a layout parameter extraction process is performed. In the layout parameter extraction process, a DRC for checking whether the layout satisfies a process condition of the RFIC or not and a LVS for checking whether the wiring connection of the layout coincides with a circuit diagram are extracted to analyze a layout characteristic (step S120).

In step S120 where the layout parameters are extracted, the layout is simplified so as to carry out the EM simulation (step S130), instead of the RCX according to the convention method in which the circuit simulation is carried out by extracting parasitic parameters.

As shown in FIG. 3, the EM simulation is carried out through the following process. First, the layout is simplified so as to be extracted as a layout for carrying out the EM simulation (step S131).

Then, the layout extracted in step S131 is converted into a GDS file which can carry out a simulation using an EM simulation tool (step S132).

Next, the EM simulation is carried out using the GDS file converted in step S132 (step S133).

Then, an S parameter serving as a performance parameter is extracted through the EM simulation carried out in step S133 (step S134).

As the EM simulation is carried out through such a method, the time required for the simulation can be reduced in comparison with the process of performing the RCX in the conventional method. Further, the performance parameter of an RFIC chip, which is to be manufactured, can be predicted at a design step. Therefore, it is possible to shorten the circuit design time.

The parameters extracted through steps S120 and S130 are applied to the circuit simulation tool so as to carry out a circuit simulation (step 140).

It is judged whether the results of the circuit simulation carried out in step S140 satisfy the design specifications of the RFIC or not (step S150).

When it is judged at step S150 that the results of the circuit simulation satisfy the design specifications of the RFIC, a process for manufacturing the RFIC is performed (step S170).

Otherwise, when it is not judged at step S150 that the results of the circuit simulation satisfy the design specifications of the RFIC, the layout is partially removed, and the EM simulation is then carried out so as to analyze a performance degradation region. Further, to satisfy the design specifications, the analyzed performance degradation region is corrected (step S160).

Hereinafter, a layout simplification method for carrying out the EM simulation according to the invention will be described with reference to the accompanying drawings.

First Embodiment

FIGS. 4A and 4B are cross-sectional views of complementary metal oxide semiconductors (CMOS) for explaining a layout simplification method according to a first embodiment of the invention.

In the layout simplification method for carrying out the EM simulation according to the first embodiment of the invention, the number of metals in a CMOS is reduced, and the remaining metals are connected through vias such that resistance caused by the metals can be reduced. Therefore, it is possible to reduce the time of the EM simulation.

As shown in FIG. 4A, the CMOS included in the RFIC is a 1P6M (one-poly six-metal) CMOS, in which a field oxide 220 serving as an insulator for isolating CMOS devices is deposited on a p-type silicon substrate 210, and an interlayer dielectric 230 for electrically isolating a poly and a first metal M1 is deposited on the field oxide 220. Further, a plurality of intermetal dielectrics 240 to 280 for electrically isolating the respective metals M1 to M6 are stacked, and a passivation layer 290 for protecting the CMOS is deposited on the sixth the metal M6. The poly and the respective metals are connected through a plurality of vias VIAP1, VIA12, VIA23, VIA34, VIA45, and VIA56.

In the above-described RFIC using the CMOS process, the number of layers is large and the structure thereof is complex, which makes it impossible to carry out a layout simulation on the entire circuit. Therefore, to carry out the EM simulation on the CMOS having such a structure, the structure of the RFIC is simplified.

That is, as shown in FIG. 4B, the second to five metals M2 to M5 are removed, and the first and sixth metals M1 and M6 are directly connected to each other through the via VIA16. Then, as shown in Table 1, resistance caused by the second to five metals M2 to M5 can be removed. Therefore, the speed of the simulation is enhanced, which makes it possible to shorten the simulation time.

TABLE 1

| Item | Sheet resistance |
| --- | --- |
| M1 | 0.078Ω |
| M2 | 0.078Ω |
| M3 | 0.078Ω |
| M4 | 0.078Ω |
| M5 | 0.078Ω |
| CTM | 0.307Ω |
| M6 | 0.0178Ω |

The layout of the CMOS can be simplified into the layout of a CMOS shown in FIG. 5, in which only the poly, the first metal M1, a CTM (capacitor top metal), and the sixth metal M6 are left.

FIG. 6 is a graph showing simulation times in accordance with the number of metals from a 1P1M CMOS to the 1P6M CMOS. As shown in FIG. 6, the EM simulation of the 1P6M CMOS having a large number of metals takes about 115 seconds. Further, the EM simulation of the 1P1M CMOS takes about 30 seconds. In FIG. 6, the simulation time is analyzed at a frequency of 2.4 GHz.

That is, when the number of metals is reduced from 1P6M to 1P2M as in the present invention, the EM simulation time can be shortened from 115 seconds to 40 seconds, which means that the EM simulation time is reduced by 75 seconds. Therefore, it is possible to shorten the time for extracting the S parameter using the EM simulation.

Second Embodiment

FIG. 7 is a circuit diagram of a 2-stage amplifier for explaining a layout simplification method according to a second embodiment of the invention. FIG. 8 is a layout for comparing the numbers of ports in the layout simplification method according to the second embodiment of the invention. FIG. 9 is a layout showing the number of ports of a transistor according to the second embodiment of the invention.

In the layout simplification method for carrying out the EM simulation according to the second embodiment of the invention, passive elements among a plurality of elements composing the RFIC are included in a transmission line. Then, the number of ports is reduced, so that the layout of the RFIC is simplified. Therefore, it is possible to shorten the EM simulation time.

As shown in FIG. 7, the 2-stage amplifier includes two transistors Q1 and Q2, resistors $R_F$, $R_D$, and $R_G$, capacitors $Cg_1$ and $Cg_2$, and inductors $L_{S1}$, $L_{S2}$, and $L_D$. The transistors Q1 and Q2 are active elements, and the resistors $R_F$, $R_D$, and $R_G$, the capacitors $Cg_1$ and $Cg_2$, and the inductors $L_{S1}$, $L_{S2}$, and $L_D$ are passive elements.

To simulate the 2-stage amplifier, all the ports of the active and passive elements should be extracted, as shown in FIG. 8. In the present invention, however, only the two transistors Q1 and Q2 serving as the active elements are excluded, and the other passive elements are included in the transmission line, as shown in FIG. 9. Therefore, the number of ports can be reduced into 6 from 22.

FIG. 10 is a graph showing a simulation time in accordance with the number of ports. As shown in FIG. 10, while the simulation time of the layout in which the number of ports is 22 takes about 150 seconds, the simulation time of the layout, in which the passive elements are included in the transmission line such that the number of ports is reduced into 6, takes about 130, which means that the simulation time can be shortened.

Third Embodiment

FIGS. 11A and 11B are cross-sectional views of layout patterns for explaining a layout simplification method according to a third embodiment of the invention.

In the layout simplification method for performing the EM simulation according to the third embodiment of the invention, a plurality of vias having the same connection in the RFIC are unified and simplified into one via. Therefore, it is possible to shorten the EM simulation time.

In the RFIC, when one metal is connected to another metal, a via is used to connect them. As shown in FIG. 11A, when a plurality of vias are used to connect metals, the metals can be connected through one via, into which the plurality of vias are unified, like the layout pattern shown in FIG. 11B.

FIG. 12 is a graph showing an EM simulation time in accordance with the number of vias. As shown in FIG. 12, when the number of vias is 100, the EM simulation time takes about 220 seconds. Further, when the number of vias is 25, the EM simulation time takes about 56 seconds.

Although not shown in FIG. 12, when the plurality of vias are unified into one via, the EM simulation time takes about 5 seconds. Therefore, as the number of vias is reduced, it is possible to shorten the EM simulation time.

As the plurality of vias for electrically connecting the metals are unified so that the number of vias is reduced, the layout of the RFIC is simplified. Therefore, it is possible to shorten the EM simulation time.

Fourth Embodiment

FIG. 13 is a diagram showing the layout of a capacitor before the capacitor is modified. FIGS. 14A and 14B are diagrams showing the layout of the capacitor simplified by a layout simplification method according to a fourth embodiment of the invention.

In the layout simplification method for carrying out the EM simulation according to the fourth embodiment of the invention, a dummy is removed from the RFIC, and a plurality of vias for connecting two metals composing the capacitor is unified and simplified into one via. Therefore, it is possible to shorten the EM simulation time.

In the layout of the capacitor shown in FIG. 13, a dummy formed in the periphery of the capacitor, the fifth and sixth metals M5 and M6, the CTM, a plurality of vias VIA56 and VIA6C are formed.

The plurality of vias VIA56 serve to electrically connect the fifth and sixth metals M5 and M6, and are formed to surround the periphery of the fifth metal M5 along the metal M6.

As shown in FIG. 14A, the dummy is removed, which is formed in the periphery of the capacitor and does not have an effect upon the capacity of the capacitor. Therefore, it is possible to shorten the EM simulation time.

Further, the plurality of vias VIA56 are unified into one via VIA561 such that the EM simulation time can be reduced. As shown in FIG. 14B, the plurality of vias VIA6C for connecting the CTM and the sixth metal M6 are unified into one via VIA6C1.

FIG. 15 is a graph comparatively showing the EM simulation times before and after the capacitor is modified. As shown in FIG. 15, when the capacitor is not modified, and when the capacity of the capacitor is set to 5700fF, the EM simulation time takes about 120 seconds. Further, when the capacity of the capacitor is set to 112fF, the EM simulation time takes about 13 seconds. However, when the layout of the capacitor is simplified by the layout simplification method according to the fourth embodiment of the invention, the EM simulation time takes about 3 seconds in both cases where the capacity of the capacitor is set to 5700fF and 112fF.

In the layout simplification method according to the fourth embodiment of the invention, the dummy is removed, the plurality of vias VIA56 for connecting the fifth and sixth metals M5 and M6 are unified into one via VIA561, and the plurality of vias VIA6C for connecting the sixth metal M6 and the CTM are unified into one via VIA6C1 such that the layout of the capacitor is simplified. Therefore, it is possible to shorten the EM simulation time.

In the method for compensating performance degradation of an RFIC using an EM simulation according to the invention, the EM simulation can be carried out by using one or more methods selected from the layout simplification methods according to the first to fourth embodiment of the invention.

FIG. 16 is a graph comparatively showing the performance of the EM simulation according to the layout simplification method and the performances of the conventional simulations in accordance with a frequency. As shown in FIG. 16, it can be found that graphs (a) and (b) do not represent similar measured values to those of a graph (c) which indicates values obtained by testing the RFIC. The graph (a) indicates values obtained through the simulation according to the conventional method, and the graph (b) indicates values obtained through the simulation carried out by extracting parasitic parameters.

On the contrary, a graph (d), which indicates values obtained through the EM simulation carried out by simplifying the layout, represents similar measured values to those of the graph (c). Accordingly, it is possible to shorten the circuit simulation time through the layout simplification method for carrying out the EM simulation. Further, as the characteristics of the RFIC is accurately grasped and verified, the design step can be predicted so as to shorten the circuit design time.

In step S150, when it is judged that the results of the EM simulation do not satisfy the design specifications and performance degradation occurs, the process is not fed back to step S110 where the circuit is re-designed and the circuit simulation is carried out, unlike the conventional method. Through the EM simulation, the performance degradation region is analyzed and discriminated so as to correct and compensate the performance degradation, which makes it possible to reduce the design time.

Now, the method for compensating performance degradation of an RFIC according to the invention will be described in more detail with reference to the accompanying drawings.

FIG. 17 is a flow chart sequentially showing the method for compensating performance degradation of an RFIC according to the invention.

As shown in FIG. 17, when it is judged at step S150 that the results of the circuit simulation, which is carried out using the layout parameters extracted in step S120 and the performance parameter extracted by the EM simulation of step S130, do not satisfy the design specifications and the performance degradation occurs, the layout is divided into a plurality of regions (step S161).

In step S150, the judging of whether the results of the circuit simulation of step S140 satisfy the design specifications or not is performed as follows. Results obtained by carrying out the circuit simulation of step S110 on a low-noise amplifier of FIG. 18 are compared with the results of the circuit simulation of step S140 to which coupling effects are applied in consideration of the layout parameters and the performance parameters. At this time, small signal gains or noise figures of the low-noise amplifier are compared so as to judge whether the performance degradation occurs or not. FIG. 18 is a circuit diagram of the low-noise amplifier for explaining the method for compensating performance degradation.

FIG. 19 is a graph showing gains of the low-noise amplifier. As shown in FIG. 19, when the low-noise amplifier operates in a high gain mode at an operation frequency of 2.4 GHz, a result m1 of the circuit simulation of step S110, which is the most ideal simulation where the layout characteristic is not analyzed, is about 10 dB. Further, a result m2 of the circuit simulation of step S140, where a layout characteristic is analyzed so that the coupling effects are applied, is about 6.8 dB. Therefore, it can be found that the gain is reduced by 3.2 dB.

FIG. 20 is a graph showing noise figures of the low-noise amplifier. As shown in FIG. 20, when the low-noise amplifier operates in the high gain mode at an operation frequency of 2.4 GHz, a result m1 of the circuit simulation of step S110 is 1.6 dB, and a result m2 of the circuit simulation of step S140 is 2.9 dB, which means that the gain increases by 1.3 dB. Therefore, it can be found that the layout is not a normal layout and the performance degradation occurs. Accordingly, it is judged at step S150 that the results of the circuit simulation do not satisfy the design specifications.

As such, when the results of the circuit simulation do not satisfy the design specifications, the layout is divided into a plurality of regions by reference to a transmission line used for connecting the respective elements from the entire layout, in order to found the position of the performance degradation region in the layout of the RFIC.

FIG. 21 is a circuit diagram of the low-noise amplifier which is divided into a plurality of regions. As shown in FIG. 21, nets A to E can be set on the transmission line used for connecting the respective elements. In this case, the nets A to E store the layout parameters and performance parameters extracted in steps S120 and S130.

Then, only one region selected from the layout divided in step S161 is removed so as to carry out the EM simulation (step S162).

After the selected region is removed so as to carry out the EM simulation, it is judged whether the EM simulation is carried out on all the regions or not (step S163). For example, the net A is removed and the EM simulation is carried out so as to record gains and noise figures of the respective regions, as shown in FIGS. 22 and 23 which are graphs showing gains and noise figures of the respective regions.

Next, after the removed net A is re-connected, the net B is removed to carry out the EM simulation. Further, gains and noise figures at this time are recorded. Through the above-described method, the EM simulation is carried out on all the regions so as to record gains and noise figures. In FIGS. 22 and 23, a CKT graph indicates the gain and noise figure of the circuit simulation of step S110, which are reference values to the results of the EM simulation. When the result of the EM simulation of step S162 is not similar to the values of the CKT but have a large difference, the region is considered to be as a region where the performance degradation occurs (step S164).

When it is judged that the net E is a region where the performance degradation occurs, the length of the transmission line of the region is reduced so as to carry out the EM simulation. When the result of the EM simulation have a gain and a noise figure similar to the CKT graph, the net E is determined as a region where the performance degradation occurs. Then, a compensation pattern is inserted into the region, thereby compensating the performance degradation.

In the compensation pattern of the net E which is the performance degradation region, the net E is grounded, because the length of the transmission line of the net E cannot be reduced on the circuit. Meanwhile, as for another compensation method, there is provided an impedance matching method. However, as shown in MAT graphs of FIGS. 24 and 25, the gain is increased only by 0.5 dB. Therefore, the impedance matching method is not considered to be an excellent compensation method.

As shown in FIGS. 24 and 25 which represent gains and noise figures before and after the performance degradation is compensated, when the performance degradation region is compensated through step S160, a result Comp of the simulation after the compensation approaches the result CKT of the ideal circuit simulation of step S110 where the layout characteristic is not analyzed, compared with a result EM of the simulation before the compensation.

In the method for compensating performance degradation of an RFIC using an EM simulation according to the invention, the performance parameters are extracted using the EM simulation, and the performance degradation region can be analyzed and corrected using the extracted performance parameters when performance degradation occurs in the circuit. Therefore, it is possible to reduce the design time, compared with the conventional method where the process should be resumed from the initial stage of design when the performance degradation occurs.

According to the method for compensating performance degradation of an RFIC using an EM simulation, the layout of the RFIC is simplified so as to carry out the EM simulation, which makes it possible to reduce the simulation time of the circuit. Further, when the results of the circuit simulation do not satisfy the circuit specifications, the performance degradation region is analyzed and compensated using the EM simulation, which makes it possible to reduce the design time.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of compensating performance degradation of a radio frequency integrated circuit (RFIC) using an EM (electromagnetic) simulation, the method comprising the steps of:
   (a) extracting design specifications of the RFIC, and designing and simulating a circuit based upon the extracted design specifications;
   (b) designing a layout of the designed and simulated circuit, and extracting layout parameters from the designed layout;
   (c) simplifying the layout and performing an EM simulation to extract performance parameters, wherein simplifying the layout includes replacing circuit elements with a simplified equivalent circuit or elements;
   (d) performing a circuit simulation using the extracted layout parameters and performance parameters;
   (e) determining whether results of the circuit simulation satisfy the design specifications of the RFIC; and
   (f) when the results of the circuit simulation of step (d) do not satisfy the design specifications of the RFIC, partially removing the layout, and carrying out the EM simulation to determine, and then compensate for, a performance degradation region;
   wherein step (f) includes the steps of:
   (f-1) dividing the layout into a plurality of regions;

(f-2) removing any one region selected from the divided layout, and carrying out the EM simulation and performance parameter extraction;
(f-3) determining whether the EM simulation is carried out on all the regions;
(f-4) when it is determined that the EM simulation is carried out on all the regions, determining and analyzing the performance degradation region of the layout, including comparing the performance parameters extracted during the EM simulation of step (c) with the performance parameters extracted during the EM simulation of step (f-2); and
(f-5) inserting a compensation pattern into the analyzed performance degradation region; and
wherein the analyzing of the performance degradation region at step (f-4) includes measuring gains of the circuit and then comparing the gains.

2. The method according to claim 1, wherein when at step (f-3) it is determined that the EM simulation is not carried out on all the regions, the process continues at step (f-2).

3. A method of compensating performance degradation of a radio frequency integrated circuit (RFIC) using an EM(electromagnetic) simulation, the method comprising the steps of:
(a) extracting design specifications of the RFIC, and designing and simulating a circuit based upon the extracted design specifications;
(b) designing a layout of the designed and simulated circuit, and extracting layout parameters from the designed layout;
(c) simplifying the layout and performing an EM simulation to extract performance parameters, wherein simplifying the layout includes replacing circuit elements with a simplified equivalent circuit or elements;
(d) performing a circuit simulation using the extracted layout parameters and performance parameters;
(e) determining whether results of the circuit simulation satisfy the design specifications of the RFIC; and
(f) when the results of the circuit simulation of step (d) do not satisfy the design specifications of the RFIC, partially removing the layout, and carrying out the EM simulation to determine, and then compensate for a performance degradation region;
wherein step (f) includes the steps of:
(f-1) dividing the layout into a plurality of regions;
(f-2) removing any one region selected from the divided layout, and carrying out the EM simulation and performance parameter extraction;
(f-3) determining whether the EM simulation is carried out on all the regions;
(f-4) when it is determined that the EM simulation is carried out on all the regions, determining and analyzing the performance degradation region of the layout, including comparing the performance parameters extracted during the EM simulation of step (c) with the performance parameters extracted during the EM simulation of step (f-2); and
(f-5) inserting a compensation pattern into the analyzed performance degradation region;
wherein the analyzing of the performance degradation region at step (f-4) includes measuring gains and noise figures of the circuit and then comparing the gains and the noise figures, respectively.

* * * * *